United States Patent
Uetani et al.

(10) Patent No.: US 8,564,175 B2
(45) Date of Patent: Oct. 22, 2013

(54) ELECTRONIC DEVICE

(75) Inventors: Masayuki Uetani, Kasugai (JP); Makoto Tani, Inazawa (JP)

(73) Assignee: NGK Insulators, Ltd., Nagoya (JP)

( * ) Notice: Subject to any disclaimer, the term of this patent is extended or adjusted under 35 U.S.C. 154(b) by 299 days.

(21) Appl. No.: 13/069,579

(22) Filed: Mar. 23, 2011

(65) Prior Publication Data

US 2011/0266922 A1 Nov. 3, 2011

(30) Foreign Application Priority Data

Mar. 31, 2010 (JP) ................................. 2010-081639

(51) Int. Cl.
*H01L 41/083* (2006.01)
(52) U.S. Cl.
CPC .................................. *H01L 41/083* (2013.01)
USPC ....................................................... 310/328
(58) Field of Classification Search
CPC .............. H01L 41/053; H01L 41/0533; H01L 41/0815; H01L 41/083
USPC ....................................................... 310/328
See application file for complete search history.

(56) References Cited

U.S. PATENT DOCUMENTS 7,705,520 B2 * 4/2010 Wada et al. .................... 310/328
2007/0228884 A1 * 10/2007 Manabe .......................... 310/328

FOREIGN PATENT DOCUMENTS

| JP | 05-316756 A1 | 11/1993 |
| JP | 09-029966 A1 | 2/1997 |
| JP | 2002-119074 A1 | 4/2002 |
| JP | 2008-205263 A1 | 9/2008 |
| JP | 2009-171591 A1 | 7/2009 |

* cited by examiner

*Primary Examiner* — Derek Rosenau
(74) *Attorney, Agent, or Firm* — Burr & Brown

(57) ABSTRACT

An electronic device includes a layered piezoelectric element and a driven member. The driven member is bonded to the top surface of the layered piezoelectric element by means of an epoxy resin adhesive. The piezoelectric element includes a side electrode on one side surface of the element, which is one of the outer surfaces of the element. The piezoelectric element includes, in the vicinity of the upper end portion of the side surface, a dam portion formed of a material for preventing epoxy bleed out of the adhesive. Therefore, even when the epoxy bleed out of the adhesive occurs, a bled-out portion of the components of the adhesive does not reach the side electrode. Thus, when the side electrode is connected to an external circuit by, for example, soldering, reduction in the connection strength or similar problems are avoided.

5 Claims, 13 Drawing Sheets

Right side surface

Right side surface

ELECTRONIC DEVICE

BACKGROUND OF THE INVENTION

1. Field of the Invention

The present invention relates to an electronic device including an element (e.g., an electric element such as a piezoelectric element or a semiconductor element), and a member which is bonded to the element by means of an epoxy resin adhesive.

2. Description of the Related Art

As shown in FIG. 13, a conventional electronic device includes a layered piezoelectric element (element) 100, and a driven member 200 (member other than the element 100) driven by the element 100. The driven member 200 is bonded, by means of an adhesive S, to a top surface 100a of the element 100 (see, for example, Patent Document No. 1).

As used in the present specification, claims, and drawings (hereinafter may be collectively referred to as "the present specification, etc."), the term "piezoelectric" encompasses "piezoelectric" and "electrostrictive." Therefore, in the present specification, etc., for example, the term "piezoelectric element" encompasses both an element having a piezoelectric effect (i.e., a piezoelectric element) and an element having an electrostrictive effect (i.e., an electrostrictive element).

The adhesive S used in such an electronic device is generally an epoxy resin adhesive. However, after application of such an epoxy resin adhesive, a portion of the "resin and additive" contained in the adhesive may ooze from the site to which the adhesive was applied. This phenomenon is called "epoxy bleed out." Thus, as shown in FIG. 13, even when the epoxy resin adhesive S is applied only to the top surface 100a, a portion of the components of the adhesive S oozes to a side surface 100b of the element 100 due to the epoxy bleed out. In this case, when an electrode (outer surface electrode) 100c is provided on the side surface 100b of the element 100, a part of the bled-out components of the adhesive S covers the electrode 100c. Therefore, when the electrode 100c is "an electrode for connecting the element 100 to an external circuit," a problem may arise in that the area of a solderable region of the electrode 100c is reduced, resulting in reduction of soldering strength, or insufficient connection to the external circuit. Further, another problem may arise in that the electrode 100c provided on the side surface 100b is impaired through reaction with a part of the bled-out components of the adhesive S.

PRIOR ART DOCUMENT

Patent Document

<Patent document No. 1> Japanese Patent Application Laid-Open (kokai) No. 2002-119074

SUMMARY OF THE INVENTION

One of objects of the present invention is to provide an electronic device which can avoid the adverse effects due to the epoxy bleed out on an electrode (outer surface electrode) provided on an outer surface of an element.

The electronic device of the present invention (hereinafter may be referred to as "the present device") comprises an element having an outer surface electrode provided on a portion of outer surfaces of the element; and a member bonded to the element by means of an epoxy resin adhesive. The element is, for example, a piezoelectric element or a semiconductor chip. The member bonded to the element may be a driven member which is driven by the element, or a substrate for fixing the element.

In the present device, the adhesive is applied to a portion of the outer surfaces of the element, the portion being different from a portion on which the outer surface electrode is located. That is, the member is bonded to a region other than a region on which the outer surface electrode is provided. Further, the present device comprises, between the adhesive and the outer surface electrode, a dam (stopper, bank) portion formed of a material which prevents epoxy bleed out of the adhesive.

The dam portion is provided between the adhesive and the outer surface electrode. Therefore, even when the epoxy bleed out occurs, a portion of the adhesive does not reach the outer surface electrode. Thus, the aforementioned problems are solved.

The material forming the dam portion is preferably a material containing a novolac epoxy resin as a main component.

Novolac epoxy resins include a phenol novolac epoxy resin and a cresol novolac epoxy resin. Novolac epoxy resins are widely known as resins for semiconductor sealing. The present inventors have found that "the novolac epoxy resin can effectively prevent the epoxy bleed out of the epoxy resin adhesive." The present inventors have also found that "oozing of the novolac epoxy resin itself due to the epoxy bleed out rarely occurs." Therefore, the novolac epoxy resin is suitable for use as a material for forming the dam portion.

The element is an element comprising a piezoelectric product including a piezoelectric layer, and a first electrode layer and a second electrode layer which face each other and sandwich the piezoelectric layer; and the outer surface electrode may include a first electrode which is "an electrode formed of an end of the first electrode layer, or an electrode layer connected to the end of the first electrode layer", and a second electrode which is "an electrode formed of an end of the second electrode layer, or an electrode layer connected to the end of the second electrode layer."

Generally, a piezoelectric element has a property which generates electric charges on its surface under a drastic change in temperature. This phenomenon is called the "pyroelectric effect." Since electric charges generated on the surface of the piezoelectric element generates an electric field in a direction opposite to a polarization direction of the piezoelectric element, the polarization of the piezoelectric element is removed (this phenomenon is called "depolarization" or "reduction of the polarization"). Therefore, the mechanical displacement of the piezoelectric element is reduced with respect to a voltage applied to the piezoelectric element. That is, the properties of the piezoelectric element are impaired.

Therefore, it is preferable that the dam portion be formed in such a manner that the dam portion has semiconductivity by adding a conductive material to the material forming the dam portion, and the dam portion reaches both the first electrode and the second electrode (i.e., the dam portion connects the first electrode with the second electrode). The conductive material may be, for example, carbon, Ag, Au, Cu, or an alloy thereof. Preferably, carbon is employed, since its resistivity can easily be adjusted to a desired level.

With this configuration, since the first electrode and the second electrode are connected by means of the semiconductive dam portion, the first electrode layer and the second electrode layer are connected through the conductor having a relatively large resistance. Therefore, occurrence of the pyroelectric effect can be suppressed. That is, a mere provision of the dam portion can solve both the problem due to epoxy bleed out of the adhesive and the problem due to occurrence of the pyroelectric effect (occurrence of depolarization) at the same time.

One of aspects of the present device may be configured as follows.

The element is a polyhedral layered piezoelectric element in which a plurality of the piezoelectric products are stacked;

Ends of two or more of a plurality of the first electrode layers included in the element are exposed on one side surface of the polyhedron;

Ends of two or more of a plurality of the second electrode layers included in the element are exposed on the one side surface of the polyhedron;

The first electrode is an electrode layer which connects, on the one side surface, the ends of the two or more of the first electrode layers exposed thereon; and The second electrode is an electrode layer which connects, on the one side surface, the ends of the two or more of the second electrode layers exposed thereon.

This configuration can provide "the electronic device comprising the layered piezoelectric element" which can solve the problems due to "the epoxy bleed out and the pyroelectric effect."

DETAILED DESCRIPTION OF THE INVENTION

Next will be described electronic devices according to embodiments of the present invention with reference to the drawings.

First Embodiment (Structure)

Figure 1:
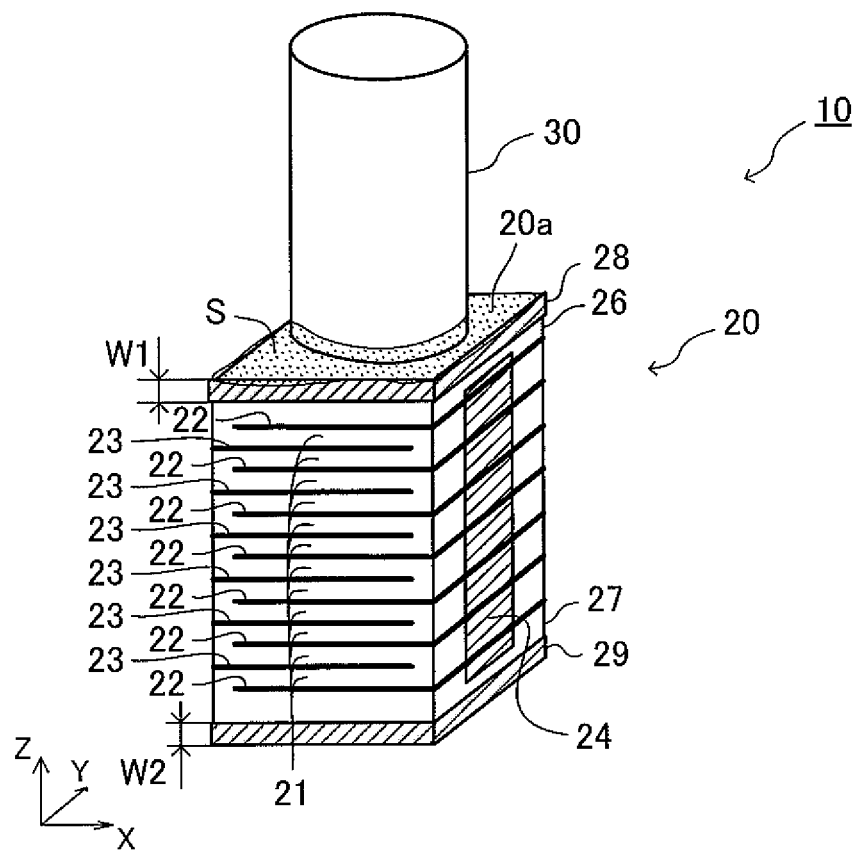
FIG. 1 is a schematic perspective view of an electronic device (first device) according to a first embodiment of the present invention.

As shown in FIG. 1, an electronic device according to the first embodiment of the present invention (hereinafter may be referred to as "the first device") 10 comprises a layered piezoelectric element (piezoelectric element) 20 and a driven member 30. The driven member 30 is, for example, a rod or a weight which slides or vibrates by expansion/contraction of the piezoelectric element 20.

Figure 2:
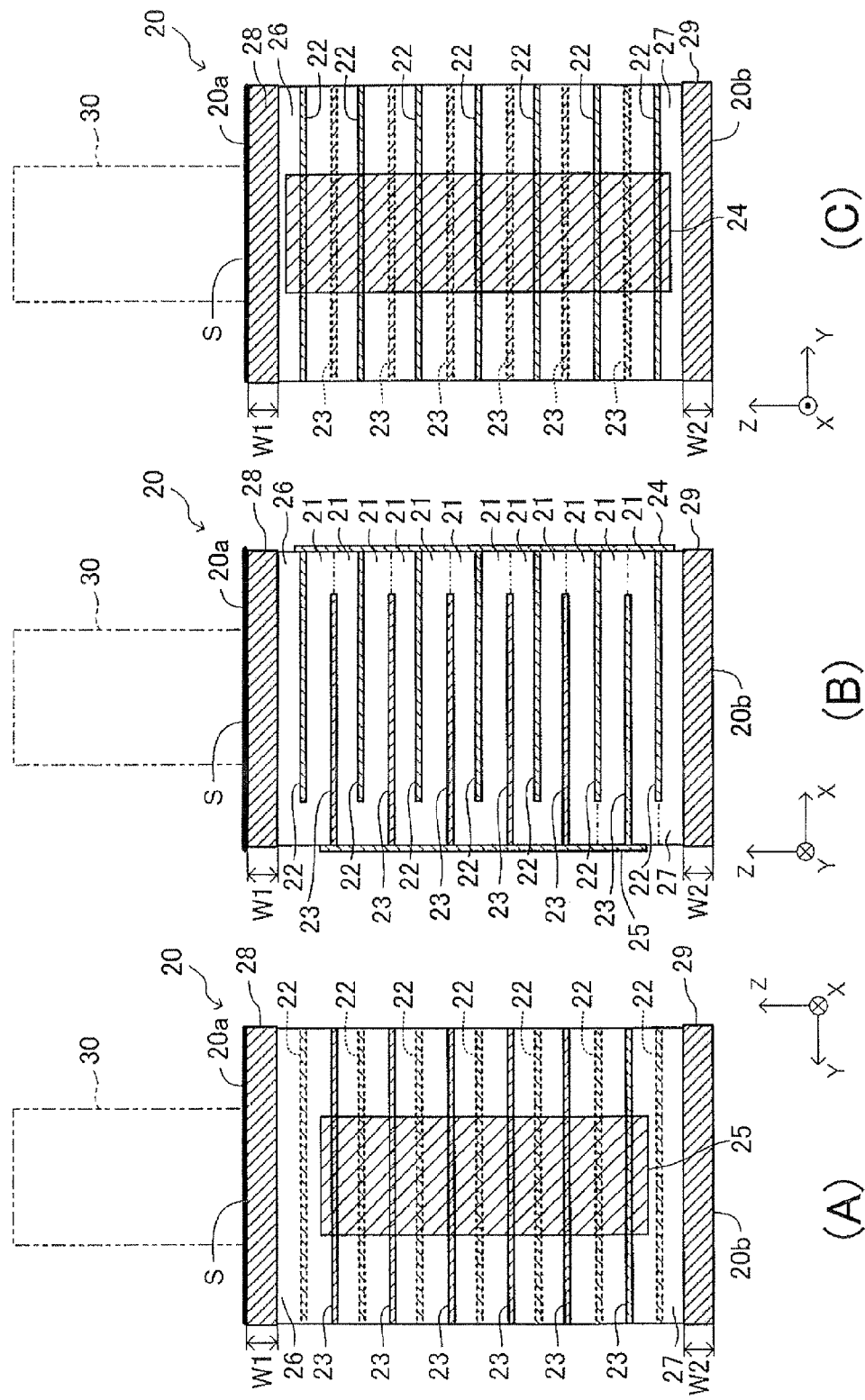
FIG. 2 includes (A), (B) and (C), wherein (A) being a left side view of the layered piezoelectric element shown in FIG. 1, (B) being a front view of the layered piezoelectric element shown in FIG. 1, and (C) being a right side view of the layered piezoelectric element shown in FIG. 1.

As shown in FIGS. 1 and 2, the piezoelectric element 20 includes a plurality of piezoelectric layers (layers formed of a piezoelectric material) 21; a plurality of first internal electrode layers 22; a plurality of second internal electrode layers 23; a first side electrode 24; a second side electrode 25; a first end piezoelectric layer 26; a second end piezoelectric layer 27; a dam portion (upper dam portion) 28; and a dam portion (lower dam portion) 29.

The piezoelectric element 20 has a rectangular parallelepiped shape having edges along the X-axis, the Y-axis, and the Z-axis, which are orthogonal to one another. In the present embodiment, the piezoelectric element 20 has a length of 1 mm in an X-axis direction, a length of 1 mm in a Y-axis direction, and a length (height) of 2 mm in a Z-axis direction.

The main component of the piezoelectric layers 21 is a piezoelectric material (e.g., lead zirconate titanate (PZT)). Each piezoelectric layer 21 has a thickness (length in a Z-axis direction) of, for example, 0.019 mm. Each piezoelectric layer 21 is formed of a fired product. Each piezoelectric layer 21 has undergone polarization treatment in a Z-axis direction. Each piezoelectric layer 21 has a square shape (1 mm for each side) as viewed from above. That is, a shape of the piezoelectric layer 21 in a plan view is a square having sides along the X-axis and the Y-axis.

The first internal electrode layers 22 are formed of a conductive material (e.g., Ag—Pd alloy, Ag, or the like). Each first internal electrode layer 22 has a thickness of, for example, 0.001 mm. Each first internal electrode layer 22 extends, in a Y-axis direction, to both ends (in a Y-axis direction) of the piezoelectric layer 21. Each first internal electrode layer 22 extends, in a positive X-axis direction, to the end (in a positive X-axis direction) of the piezoelectric layer 21. Each first internal electrode layer 22 extends, in a negative X-axis direction, to the vicinity of the end (in a negative X-axis direction) of the piezoelectric layer 21, but the end (in a negative X-axis direction) of the layer 22 does not reach the end (in a negative X-axis direction) of the layer 21.

The second internal electrode layers 23 are formed of the same conductive material as the first internal electrode layers 22 (e.g., Ag—Pd alloy, Ag. or the like). Each second internal electrode layer 23 has the same thickness as each first internal electrode layer 22. Each second internal electrode layer 23 extends, in a Y-axis direction, to both ends (in a Y-axis direction) of the piezoelectric layer 21. Each second internal electrode layer 23 extends, in a negative X-axis direction, to the end (in a negative X-axis direction) of the piezoelectric layer 21. Each second internal electrode layer 23 extends, in a positive X-axis direction, to the vicinity of the end (in a positive X-axis direction) of the piezoelectric layer 21, but the end (in a positive X-axis direction) of the layer 23 does not reach the end (in a positive X-axis direction) of the layer 21. Each second internal electrode layer 23 is positioned so as to face the corresponding first internal electrode layer 22 via the piezoelectric layer 21 provided therebetween. That is, the first internal electrode layer 22 and the second internal electrode layer 23 are provided so as to face each other via the piezoelectric layer 21 sandwiched therebetween.

Figure 3:
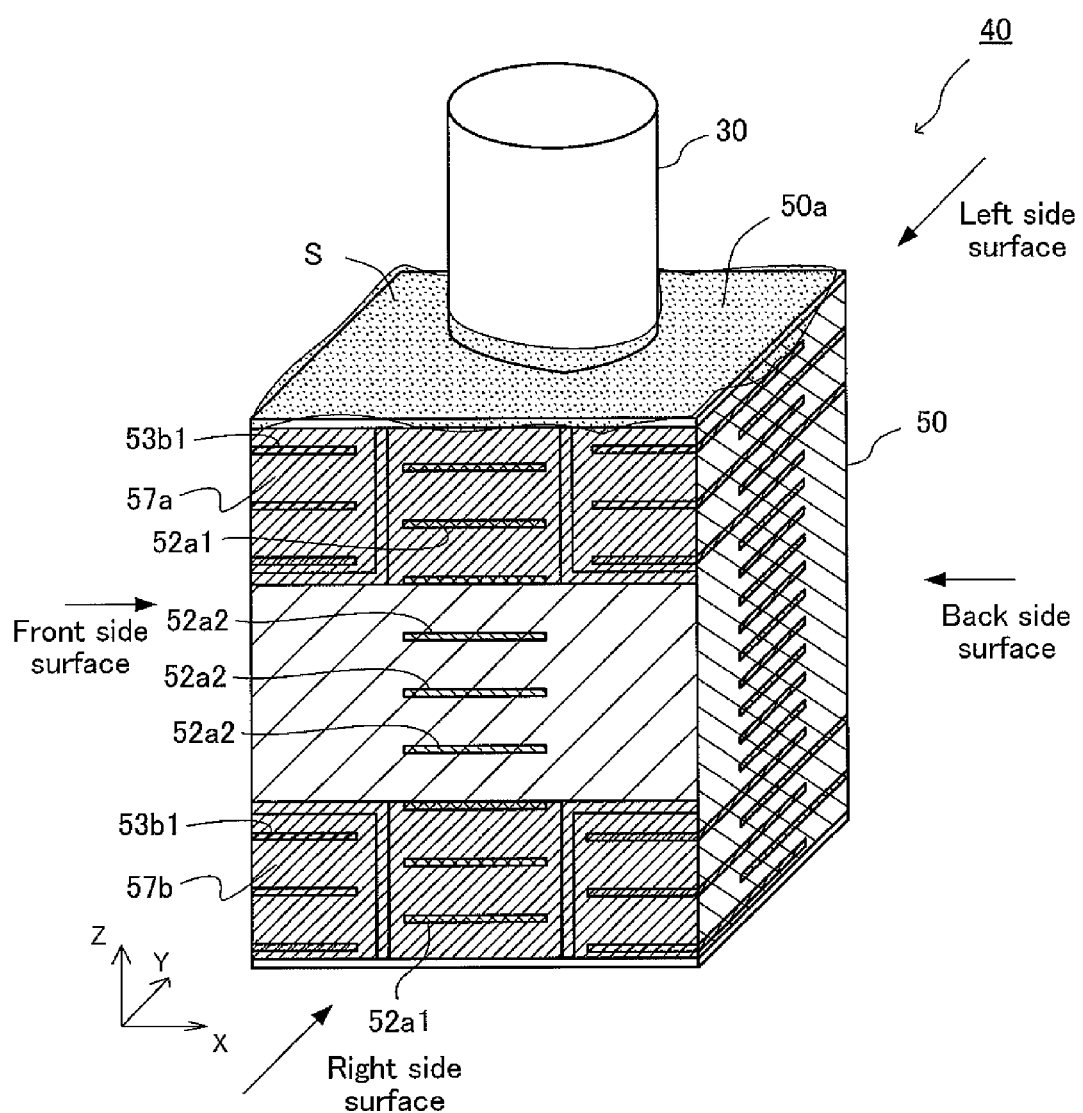
FIG. 3 is a schematic perspective view of an electronic device (second device) according to a second embodiment of the present invention.

In the piezoelectric element 20, the piezoelectric layers 21, each being sandwiched between the first internal electrode layer 22 and the second internal electrode layer 23, are stacked (or layered) in a Z-axis direction (i.e., a layer stacking direction, or a direction orthogonal to the main surface of each layer). In other words, the first internal electrode layers 22 and the second internal electrode layers 23 are alternately stacked in such a manner that a pair of the facing layers 22 and 23 sandwiches the corresponding piezoelectric layer 21. No particular limitation is imposed on the number of the piezoelectric layers 21, and the number of the layers 21 is, for example, ninety. However, for the sake of simplification of description, twelve piezoelectric layers 21 are shown in FIGS. 1 to 3.

The first side electrode 24 is an electrode layer formed on the right side surface of the piezoelectric element 20 (i.e., surface at the end in a positive X-axis direction, and the surface being parallel with a Y-Z plane). The first side electrode 24 is formed of the same conductive material as the first internal electrode layer 22 (e.g., Ag—Pd alloy, Ag, or the like). As viewed from front, the first side electrode 24 has a rectangular form elongated in a height direction of the piezoelectric element 20 (i.e., Z-axis direction). The first side electrode 24 is electrically connected to all the first internal electrode layers 22. The first side electrode 24 is soldered to a non-illustrated conductor wire connected to an external drive circuit.

The second side electrode 25 is an electrode layer formed on the left side surface of the piezoelectric element 20 (i.e., surface at the end in a negative X-axis direction, and the surface being parallel with a Y-Z plane). The second side electrode 25 is formed of the same conductive material as the first internal electrode layer 22 (e.g., Ag—Pd alloy, Ag, or the like). As viewed from front, the second side electrode 25 has a rectangular form elongated in a height direction of the piezoelectric element 20 (i.e., Z-axis direction). The second side electrode 25 is electrically connected to all the second internal electrode layers 23. The second side electrode 25 is soldered to a non-illustrated conductor wire connected to the external drive circuit.

The first end piezoelectric layer 26 is stacked on the uppermost piezoelectric layer 21 (and on the uppermost first internal electrode layer 22). The first end piezoelectric layer 26 is also called "an upper end piezoelectric layer 26." The main component of the first end piezoelectric layer 26 is the same as that of the piezoelectric layer 21. The first end piezoelectric layer 26 is formed of a fired product. The top surface 20a of the first end piezoelectric layer 26 is exposed. As described hereinbelow, an adhesive S is applied to the top surface 20a, and the driven member 30 is bonded to a generally center portion of the top surface 20a.

The second end piezoelectric layer 27 is stacked on the lowermost piezoelectric layer 21 (and on the lowermost first internal electrode layer 22). The second end piezoelectric layer 27 is also called "a lower end piezoelectric layer 27." The main component of the second end piezoelectric layer 27 is the same as that of the piezoelectric layer 21. The second end piezoelectric layer 27 is formed of a fired product. The bottom surface 20b of the second end piezoelectric layer 27 is exposed. The bottom surface 20b may be bonded to a member (e.g., a substrate) by means of the adhesive S. In this case, the adhesive S is applied only to the bottom surface of the piezoelectric element 20.

A portion of each of a plurality of the stacked piezoelectric layers 21 that is sandwiched between adjacent and facing "first internal electrode layer 22 and second internal electrode layer 23" corresponds to an active portion. Specifically, the active portion is a portion which is displaced (i.e., a portion which expands or contracts particularly in a Z-axis (height) direction) through application of a changing electric field thereto by application of a "changing voltage (potential difference)" between the first internal electrode layer 22 and the second internal electrode layer 23.

The dam portion (upper dam portion) 28 is formed of a material containing a novolac epoxy resin as a main component. The dam portion 28 is provided in a belt form on an upper end portion (end portion in a positive Z-axis direction) of the piezoelectric element 20. Specifically, the dam portion 28 is formed on the right side surface, front side surface, left side surface, and back side surface (i.e., surfaces parallel with the Z-axis (layer stacking direction), hereinafter the surfaces may be referred to as the "vertical walls") of the piezoelectric element 20 in such a manner that the dam portion 28 has a specific width (generally constant width) W1 as measured from each upper edge of the piezoelectric element 20 (i.e., edge at the boundary between the top surface 20a and each vertical wall).

More specifically, the dam portion 28 is provided on the right side surface of the piezoelectric element 20 between the upper end of the first side electrode 24 and the upper edge of the element 20 in such a manner that the dam portion 28 has the specific width W1 (see (C) of FIG. 2). Further, the dam portion 28 is provided on the front side surface of the piezoelectric element 20 in such a manner that the dam portion 28 has the specific width W1 as measured from the upper edge of the element 20 (see (B) of FIG. 2). Furthermore, the dam portion 28 is provided on the left side surface of the piezoelectric element 20 between the upper end of the second side electrode 25 and the upper edge of the element 20 in such a manner that the dam portion 28 has the specific width W1 (see (A) of FIG. 2). In addition, the dam portion 28 is provided on the back side surface of the piezoelectric element 20 in such a manner that the dam portion 28 has the specific width W1 as measured from the upper edge of the element 20.

The dam portion (lower dam portion) 29 is provided in a belt form on a lower end portion (end portion in a negative Z-axis direction) of the piezoelectric element 20. Specifically, the dam portion 29 is formed on the vertical walls of the piezoelectric element 20 in such a manner that the dam portion 29 has a specific width (generally constant width) W2 as measured from each lower edge of the piezoelectric element 20 (i.e., edge at the boundary between the bottom surface 20b and each vertical wall).

More specifically, the dam portion 29 is provided on the right side surface of the piezoelectric element 20 between the lower end of the first side electrode 24 and the lower edge of the element 20 in such a manner that the dam portion 29 has the specific width W2 (see (C) of FIG. 2). Further, the dam portion 29 is provided on the front side surface of the piezoelectric element 20 in such a manner that the dam portion 29 has the specific width W2 as measured from the lower edge of the element 20 (see (B) of FIG. 2). Furthermore, the dam portion 29 is provided on the left side surface of the piezoelectric element 20 between the lower end of the second side electrode 25 and the lower edge of the element 20 in such a manner that the dam portion 29 has the specific width W2 (see (A) of FIG. 2). In addition, the dam portion 29 is provided on the back side surface of the piezoelectric element 20 in such a manner that the dam portion 29 has the specific width W2 as measured from the lower edge of the element 20.

The driven member 30 has a cylindrical shape. Therefore, the bottom surface of the driven member 30 is flat. The driven member 30 is bonded to the piezoelectric element 20 by bonding the bottom surface of the member 30 to a center portion of the top surface 20a of the element 20 by means of the adhesive S. The driven member 30 may have a shape other than a cylindrical shape.

The driven member 30 is formed of, for example, a material containing, as a main component, any one of "carbon, a heavy metal, a heavy metal carbide, a heavy metal boride, and a heavy metal nitride." The heavy metal (heavy metal element) employed in the driven member is particularly preferably, for example, tungsten or tantalum. Preferably, tungsten carbide (WC), tungsten boride (WB), tantalum nitride (TaN), or the like is employed.

In a production process for the piezoelectric element, the adhesive S is applied only to the top surface 20a (and the bottom surface 20b). The adhesive S is an epoxy adhesive. The adhesive S employed is preferably an adhesive having a "tensile shear strength" of 15 N/mm$^2$ or more as measured through the method according to "JIS K6850." The adhesive S preferably has a viscosity of 50 to 200 Pa·s before curing.

As described above, in the piezoelectric element 20, the ends of the first internal electrode layers 22, the ends of the second internal electrode layers 23, the first side electrode 24, and the second side electrode 25 are provided on the surfaces (outer surfaces) of the piezoelectric element 20. That is, these electrodes and electrode ends constitute outer surface electrodes provided on the outer surfaces of the piezoelectric element 20. The driven member 30 constitutes (corresponds to) a member which is bonded to the piezoelectric element 20 by means of the epoxy resin adhesive S. The adhesive S is applied to "a portion of the outer surfaces of the piezoelectric element 20" other than "a portion of the outer surfaces of the piezoelectric element 20 on which the "outer surface electrodes" are provided (in the present embodiment, the adhesive S is applied to the top surface 20a and the bottom surface 20b)".

(Production Method)

The electronic device 10 is produced through any well known method. Next will be briefly described a method for producing the aforementioned electronic device 10.

1. First Step (Formation of Piezoelectric Tape)

Firstly, through the doctor blade method, "a plurality of piezoelectric tapes (first piezoelectric tapes that are ceramic green sheets)" which will form the piezoelectric layers 21, and "a plurality of piezoelectric tapes (second piezoelectric tapes that are ceramic green sheets)" which will form "the first end piezoelectric layer and the second end piezoelectric layer" are prepared.

2. Second Step (Printing of Internal Electrode Layer)

Subsequently, a conductive layer having a specific pattern is formed on each of the first piezoelectric tapes through screen printing. The conductive layer becomes the first internal electrode layer 22 or the second internal electrode layer 23 after firing.

3. Third Step (Printing of Adhesive Layer)

An adhesive paste is applied to each piezoelectric tape through screen printing.

4. Fourth Step (Layer Stacking)

A plurality of first piezoelectric tapes are stacked on a single second piezoelectric tape, and a single second piezoelectric tape is stacked on the first piezoelectric tapes, to thereby produce a layered product (body). While the layered product is heated, pressure is applied thereto for thermal compression bonding of the stacked piezoelectric tapes.

5. Fifth Step (Degreasing Treatment)

The thus-produced layered product is heated to a specific temperature (a temperature equal to or lower than the firing temperature) for degreasing.

6. Sixth Step (Firing, Main Firing)

The thus-degreased layered product is heated to the firing temperature and fired, to thereby produce a fired product.

7. Seventh Step (Surface Polishing, Thickness Adjustment)

The top surface of the fired product is subjected to surface polishing.

8. Eighth Step (Separation/Cutting)

The surface-polished fired product is cut into individual piezoelectric elements 20 through dicing.

9. Ninth Step (Formation of Side Electrode)

The first side electrode 24 and the second side electrode 25 are formed through screen printing.

10. Tenth Step (Formation of Protective Film)

Protective films are formed on the front side surface and back side surface of the piezoelectric element 20 through screen printing.

11. Eleventh Step (Formation of Dam Portion)

A material containing a novolac epoxy resin as a main component is applied to upper end portions of the vertical walls (right side surface, left side surface, front side surface, and back side surface) of the piezoelectric element 20 so that each of the material-applied portions has a specific width W1, and thereafter, the material is cured under heating. Similarly, the novolac-epoxy-resin-containing material is applied to lower end portions of the vertical walls of the piezoelectric element 20 so that each of the material-applied portions has a specific width W2, and thereafter, the material is cured under heating.

12. Twelfth Step (Polarization Treatment)

The piezoelectric layer 21 is subjected to polarization treatment through application of voltage thereto by a well known technique.

13. Thirteenth Step (Examination)

The thus-obtained piezoelectric element 20 is examined in terms of electric properties and appearance.

Thereafter, the adhesive S is applied to the top surface 20a of the piezoelectric element 20, and the driven member 30 is bonded to the element 20. Optionally, the adhesive S is applied to the bottom surface 20b, and the piezoelectric element 20 is bonded to another member (e.g., a substrate). Thus, the electronic device 10 is produced.

As described above, the piezoelectric element 20 has the dam portion 28 (and the dam portion 29) formed of a material containing a novolac epoxy resin as a main component. Novolac epoxy resins include a phenol novolac epoxy resin and a cresol novolac epoxy resin. Novolac epoxy resins are widely known as resins for semiconductor sealing. The present inventors have found that "a novolac epoxy resin can effectively prevent epoxy bleed out of an epoxy resin adhesive". The present inventors have also found that "oozing of a novolac epoxy resin itself due to epoxy bleed out rarely occurs."

Therefore, even when a portion of the components of the epoxy resin adhesive S applied to the top surface 20a (and the bottom surface 20b) oozes due to the epoxy bleed out of the adhesive S, propagation of the epoxy bleed out is blocked by the dam portion 28 (and the dam portion 29). Thus, a bled-out portion of the adhesive S does not reach the outer surface electrodes (e.g., the first side electrode 24, the second side electrode 25, the electrode formed of the ends of the first internal electrode layers 22 exposed on the front side or back side surface of the piezoelectric element 20, and the electrode formed of the ends of the second internal electrode layers 23 exposed on the front or back side surface of the piezoelectric element 20). Therefore, when the first side electrode 24 or the second side electrode 25 is soldered to the wire for connecting the electrode to the external circuit, the soldering strength is not affected by the epoxy bleed out. Thus, the piezoelectric element 20 having high reliability in connection to the external circuit is provided. In addition, the material of the surface electrodes can be selected without consideration of reaction between the material and the "portion of the components of the adhesive S," which would otherwise ooze due to the epoxy bleed out of the adhesive S.

It should be noted that, when the bottom surface 20b of the piezoelectric element 20 is not bonded to a member (e.g., a substrate), the lower dam portion 29 may be omitted. Furthermore, the front side surface and the back side surface of the piezoelectric element 20 (i.e., the vertical walls on which neither the first side electrode 24 nor the second side electrode 25 is provided) may be covered with non-illustrated protective films. In this case, the dam portion 28 (and the dam portion 29) which is/are provided on the front side surface and the back side surface is/are not necessarily. Furthermore, each of the dam portion 28 and the dam portion 29 does not necessarily have a constant width. It is preferable, however, that each of the dam portion 28 and the dam portion 29 be formed in such a manner that, at least, it traverses (or intersects with) a "straight line connecting a portion to which the adhesive S is applied and each outer surface electrode, the line being along the corresponding surface of the piezoelectric element 20."

Second Embodiment

Structure

As shown in FIG. 3, the electronic device according to the second embodiment of the present invention (hereinafter may be referred to as "the second device") 40 includes a piezoelectric element (layered piezoelectric element) 50 and a driven member 30. The driven member 30 is the same as the driven member 30 included in the first device 10. The piezoelectric element 50 has a rectangular parallelepiped shape as in the case of the piezoelectric element 20. It should be noted that in the second embodiment, the relationship between each surface (outer surface) of the piezoelectric element 50 and the corresponding coordinate axis is as follows.

Front side surface: surface at the end (in a negative X-axis direction) of the piezoelectric element 50 and parallel with a Y-Z plane.

Back side surface: surface at the end (in a positive X-axis direction) of the piezoelectric element 50 and parallel with a Y-Z plane.

Right side surface: surface at the end (in a negative Y-axis direction) of the piezoelectric element 50 and parallel with an X-Z plane.

Left side surface: surface at the end (in a positive Y-axis direction) of the piezoelectric element 50 and parallel with an X-Z plane.

Top surface: surface at the end (in a positive Z-axis direction) of the piezoelectric element 50 and parallel with an X-Y plane.

Bottom surface: surface at the end (in a negative Z-axis direction) of the piezoelectric element 50 and parallel with an X-Y plane.

As shown in FIGS. 4 to 11, the piezoelectric element 50 includes the following "layers (or films)."

Piezoelectric layers: active piezoelectric layer 51a, upper inactive piezoelectric layer 51b, and lower inactive piezoelectric layer 51c.

First internal electrode layers: type A1 electrode layer 52a1 and type A2 electrode layer 52a1

Second internal electrode layers: type B1 electrode layer 53b1 and type B2 electrode layer 53b2.

Right side electrodes: right side main electrode layer 54a and right side sub-electrode layer 54b.

Left side electrodes: left side main electrode layer 55a and left side sub-electrode layer 55b.

Protective films: front side protective film and back side protective film 56b.

Right side dam portions: right side upper dam portion 57a and right side lower dam portion 57b.

Left side dam portions: left side upper dam portion 58a and left side lower dam portion 58b.

The piezoelectric layers include active piezoelectric layers 51a, an upper inactive piezoelectric layer 51b, and a lower inactive piezoelectric layer 51c.

The active piezoelectric layer 51a is similar to the piezoelectric layer 21 of the piezoelectric element 20. The piezoelectric element 50 includes a plurality of the active piezoelectric layers 51a.

The upper inactive piezoelectric layer 51b is similar to the first end piezoelectric layer 26 of the piezoelectric element 20.

The lower inactive piezoelectric layer 51c is similar to the second end piezoelectric layer 27 of the piezoelectric element 20.

The first internal electrode layer and the second internal electrode layer are formed of the same material as the first internal electrode layer 22.

The first internal electrode layers include a plurality of "type A1 electrode layers 52a1" and a plurality of "type A2 electrode layers 52a2." That is, the piezoelectric element 50 includes a plurality of "type A1 electrode layers 52a1" and a plurality of "type A2 electrode layers 52a2."

The second internal electrode layers include a plurality of "type B1 electrode layers 53b1" and a plurality of "type B2 electrode layers 53b2." That is, the piezoelectric element 50 includes a plurality of "type B1 electrode layers 53b1" and a plurality of "type B2 electrode layers 53b2."

The first internal electrode layer (type A1 electrode layer 52a1 or type A2 electrode layer 52a2) and the second internal electrode layer (type B1 electrode layer 53b1 or type B2 electrode layer 53b2) are provided so as to face each other via the active piezoelectric layer sandwiched therebetween.

Figure 4:
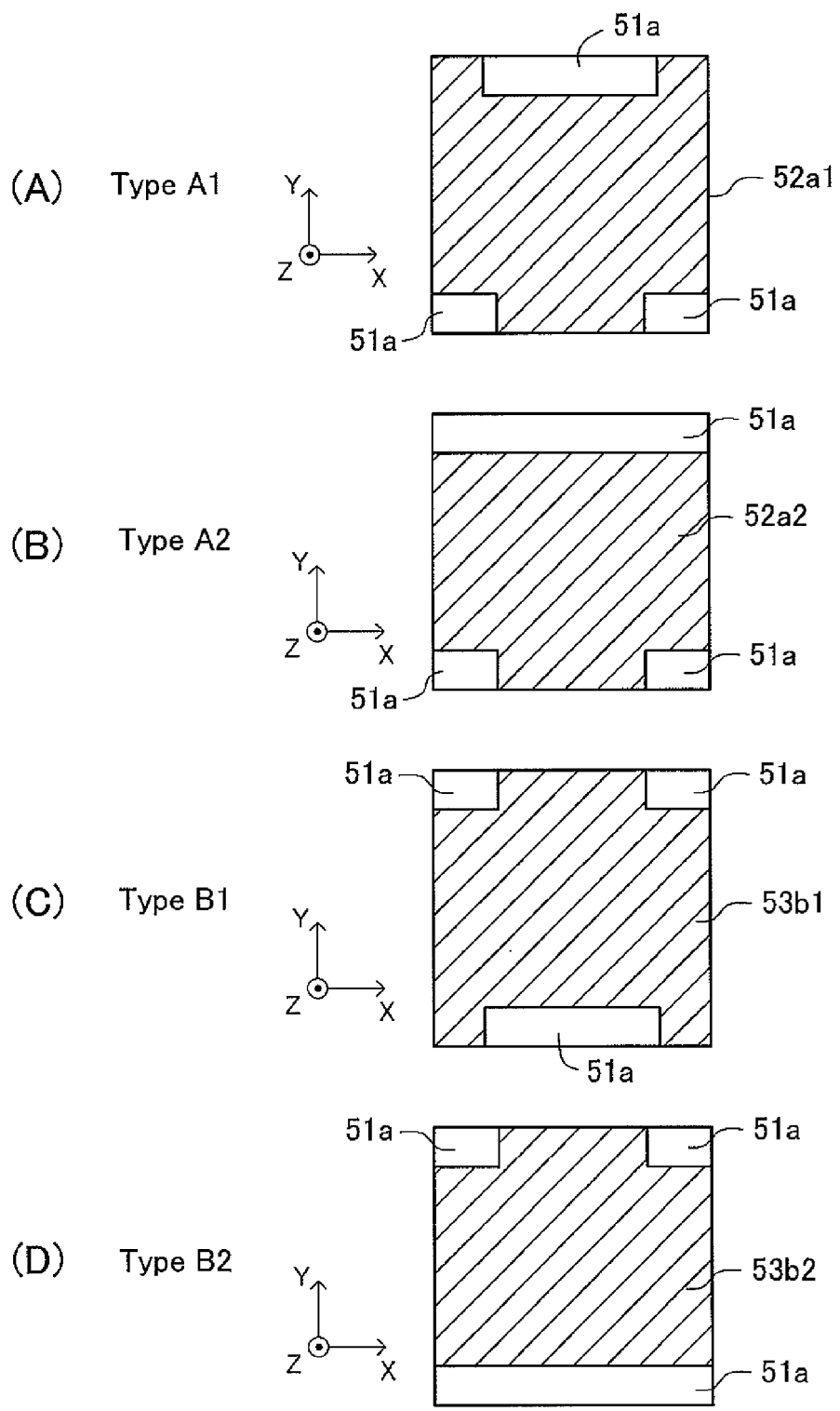
FIG. 4 shows plan views of various internal electrode layers employed in the second device shown in FIG. 3.

FIG. 4 shows shapes of the respective internal electrode layers. In FIG. 4, a white (unshaded) portion corresponds to the active piezoelectric layer 51a provided below each electrode layer.

The type A1 electrode layer 52a1 is an electrode layer which has a shape in a plan view shown in (A) of FIG. 4.

The end (in a negative Y-axis direction) of the type A1 electrode layer 52a1 reaches only the vicinity of a center portion (in an X-axis direction) of the end (in a negative Y-axis direction) of the active piezoelectric layer 51a.

The end (in a positive Y-axis direction) of the type A1 electrode layer 52a1 reaches only the vicinity of both end portions (in an X-axis direction) of the end (in a positive Y-axis direction) of the active piezoelectric layer 51a.

Both ends (in an X-axis direction) of the type A1 electrode layer 52a1 reach both ends (in an X-axis direction) of the active piezoelectric layer 51a, exclusive of portions in the vicinity of the end in a negative Y-axis direction.

The type A2 electrode layer 52a2 is a electrode layer which has a shape in a plan view shown in (B) of FIG. 4.

The end (in a negative Y-axis direction) of the type A2 electrode layer 52a2 reaches only the vicinity of a center portion (in an X-axis direction) of the end (in a negative Y-axis direction) of the active piezoelectric layer 51a.

The end (in a positive Y-axis direction) of the type A2 electrode layer 52a2 reaches a position a specific distance away from the end (in a positive Y-axis direction) of the active piezoelectric layer 51a.

Both ends (in an X-axis direction) of the type A2 electrode layer 52a2 reach both ends (in an X-axis direction) of the active piezoelectric layer 51a, exclusive of portions in the vicinity of both ends in a Y-axis direction.

The type B1 electrode layer 53b1 is an electrode layer which has a shape in a plan view shown in (C) of FIG. 4.

The end (in a positive Y-axis direction) of the type B1 electrode layer 53b1 reaches only the vicinity of a center portion (in an X-axis direction) of the end (in a positive Y-axis direction) of the active piezoelectric layer 51a.

The end (in a negative Y-axis direction) of the type B1 electrode layer 53b1 reaches only the vicinity of both end portions (in an X-axis direction) of the end (in a negative Y-axis direction) of the active piezoelectric layer 51a.

Both ends (in an X-axis direction) of the type B1 electrode layer 53b1 reach both ends (in an X-axis direction) of the active piezoelectric layer 51a, exclusive of portions in the vicinity of the ends in a positive Y-axis direction.

That is, the type B1 electrode layer 53b1 has the form which is the same as one obtained when the type A1 electrode layer 52a1 is rotated by 180° about the Z-axis, The type B2 electrode layer 53b2 is an electrode layer which has a shape in a plan view shown in (D) of FIG. 4.

The end (in a positive Y-axis direction) of the type B2 electrode layer 53b2 reaches only the vicinity of a center portion (in an X-axis direction) of the end (in a positive Y-axis direction) of the active piezoelectric layer 51a.

The end (in a negative Y-axis direction) of the type B2 electrode layer 53b2 reaches a position a specific distance away from the end (in a negative Y-axis direction) of the active piezoelectric layer 51a.

Both ends (in an X-axis direction) of the type B2 electrode layer 53b2 reach both ends (in an X-axis direction) of the active piezoelectric layer 51a, exclusive of portions in the vicinity of both ends in a Y-axis direction.

That is, the type B2 electrode layer 53b2 has the form which is the same as one obtained when the type A2 electrode layer 52a2 is rotated by 180° about the Z-axis.

Figure 5:
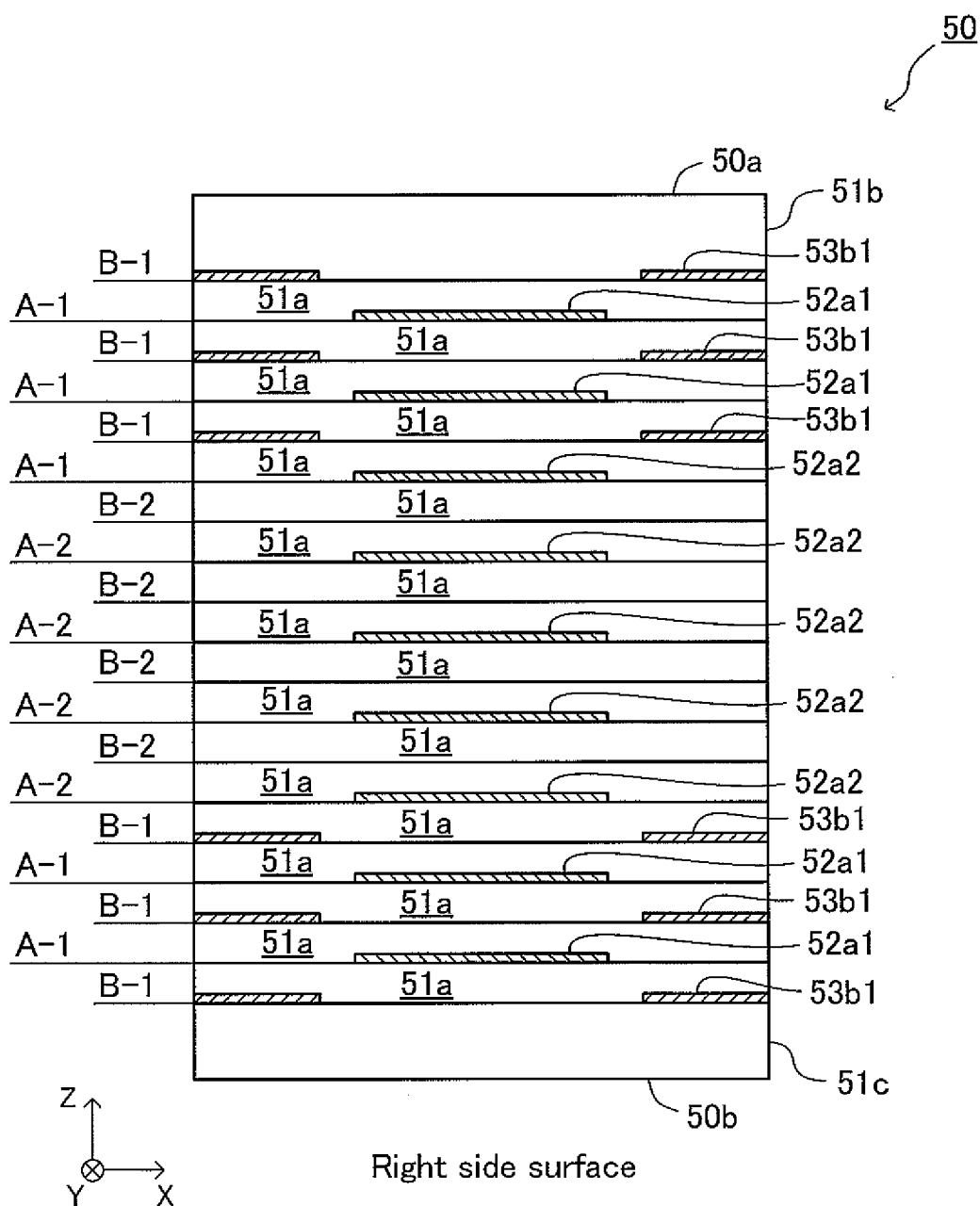
FIG. 5 is a right side view of the piezoelectric element shown in FIG. 3.
Figure 6:
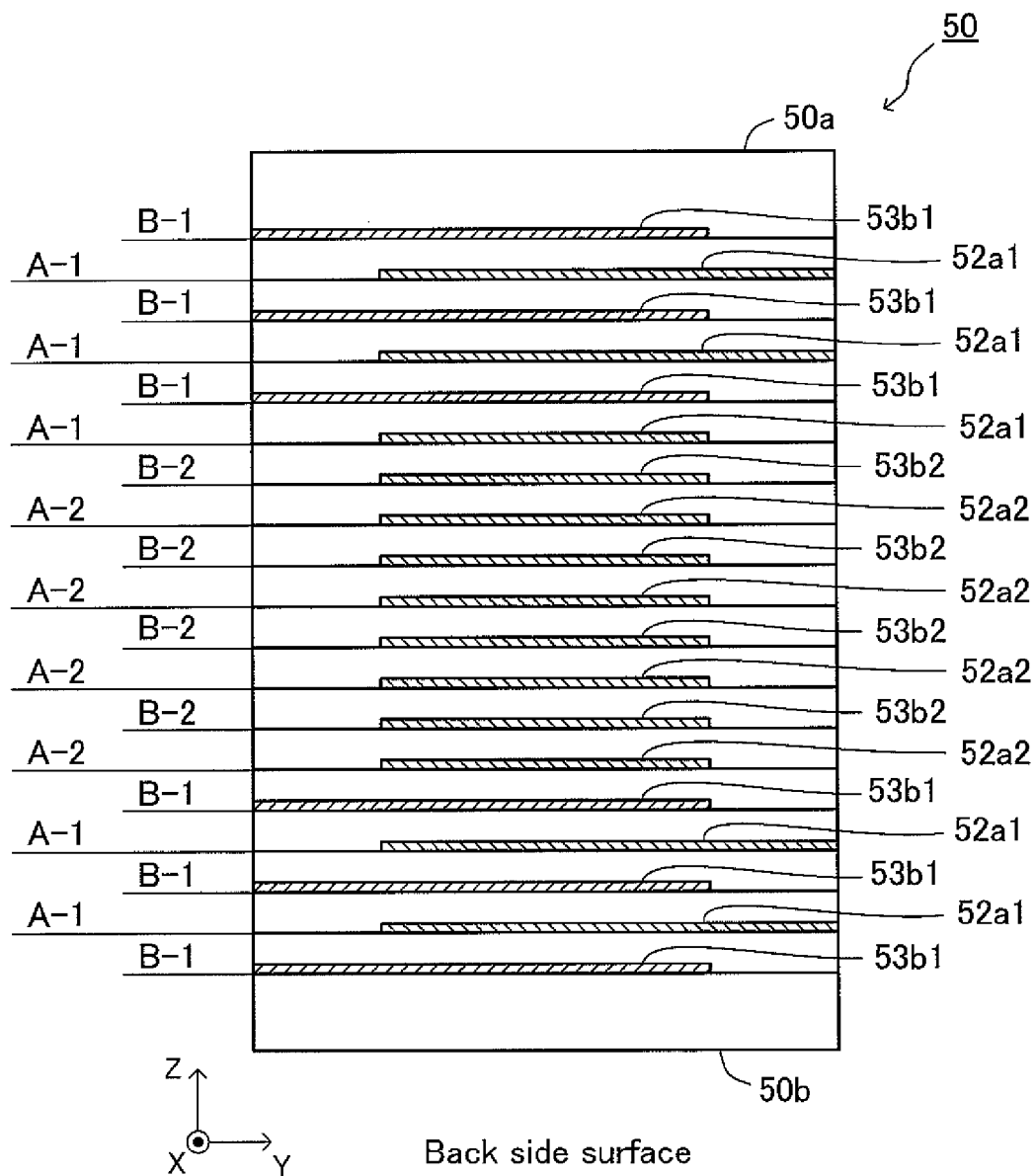
FIG. 6 is a back side view of the piezoelectric element shown in FIG. 3.

In the piezoelectric element 50, as shown in FIG. 5, a plurality of the active piezoelectric layers 51a are stacked on the lower inactive piezoelectric layer 51c, and the upper inactive piezoelectric layer 51b is stacked on the active piezoelectric layer 51a located at the uppermost portion of the layered body. The piezoelectric element 50 is a layered piezoelectric element in which each of the active piezoelectric layers is sandwiched between the facing first internal electrode layer and second internal electrode layer.

The first internal electrode layers (type A1 electrode layer 52a1 and type A2 electrode layer 52a2) and the second internal electrode layers (type B1 electrode layer 53b1 and type B2 electrode layer 53b2) are stacked in the order shown in FIGS. 5 to 11. In these figures, "A-1" corresponds to a layer on which the type A1 electrode layer 52a1 is formed. Similarly, "A-2" corresponds to a layer on which the type A2 electrode layer 52a2 is formed; "B-1" corresponds to a layer on which the type B1 electrode layer 53b1 is formed; and "B-2" corresponds to a layer on which the type B2 electrode layer 53b2 is formed.

Figure 7:
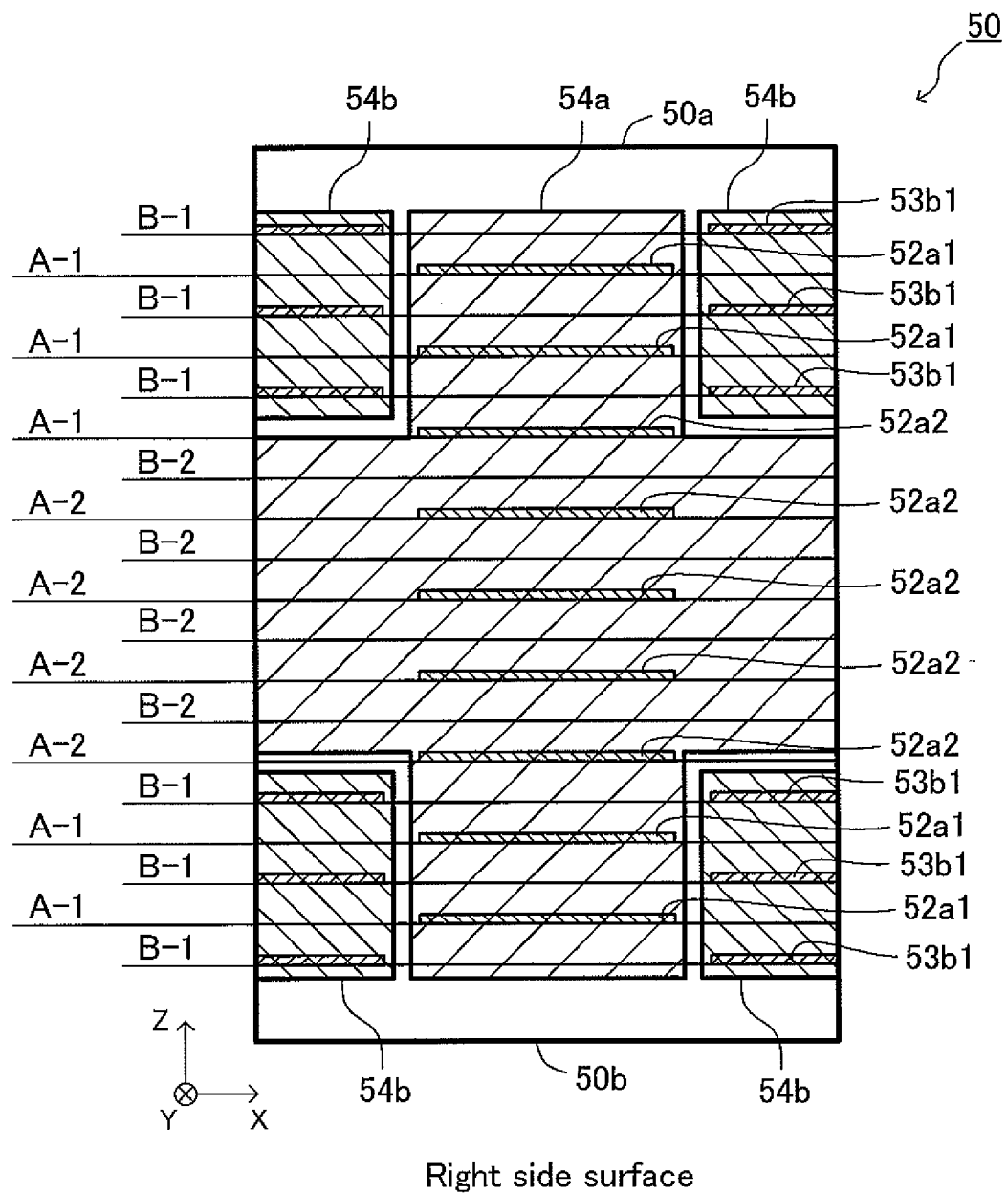
FIG. 7 is a right side view of the piezoelectric element shown in FIG. 3.

As shown in FIG. 7, the right side electrode includes one right side main electrode layer 54a and four right side sub-electrode layers 54b. The right side main electrode layer 54a and the right side sub-electrode layers 54b are formed on the right side surface of the piezoelectric element 50.

The right side main electrode layer 54a has a cross shape as viewed from front. More specifically, both of ends (in an X-axis direction) of a center portion (in a Z-axis direction) of the right side main electrode layer 54a reach both edges (in an X-axis direction) of the piezoelectric element 50. Both of ends (in a Z-axis direction) of a center portion (in an X-axis direction) of the right side main electrode layer 54a reach positions a specific distance away from both edges (in a Z-axis direction) of the piezoelectric element 50; i.e., both of the ends of the center portion do not reach the upper and lower edges of the piezoelectric element 50. The right side main electrode layer 54a is formed so as to cover the ends of the first internal electrode layers 52 (type A1 electrode layers 52a1 and type A2 electrode layers 52a2) exposed on the right side surface of the piezoelectric element 50. Thus, the right side main electrode layer 54a connects the first internal electrode layers together on "the right side surface (i.e., one side surface) of the piezoelectric element 50."

Each of the right side sub-electrode layers 54b has a rectangular shape as viewed from front. More specifically, the right side sub-electrode layers 54b are provided on four corners of the right side surface of the piezoelectric element 50. In other words, the right side sub-electrode layers 54b are provided on regions of the right side surface of the piezoelectric element 50 that are not covered with the right side main electrode layer 54a. Each of the right side sub-electrode layers 54b is formed so as to cover "the ends of the second internal electrode layers (actually, the type B1 electrode layers 53b1)" exposed on the right side surface of the piezoelectric element 50. Therefore, each of the right side sub-electrode layers 54b connects the second internal electrode layers exposed on the right side surface of the piezoelectric element 50. Each of the right side sub-electrode layers 54b is positioned a slight distance away from the right side main electrode layer 54a, and is not connected to the right side main electrode layer 54a.

Figure 8:
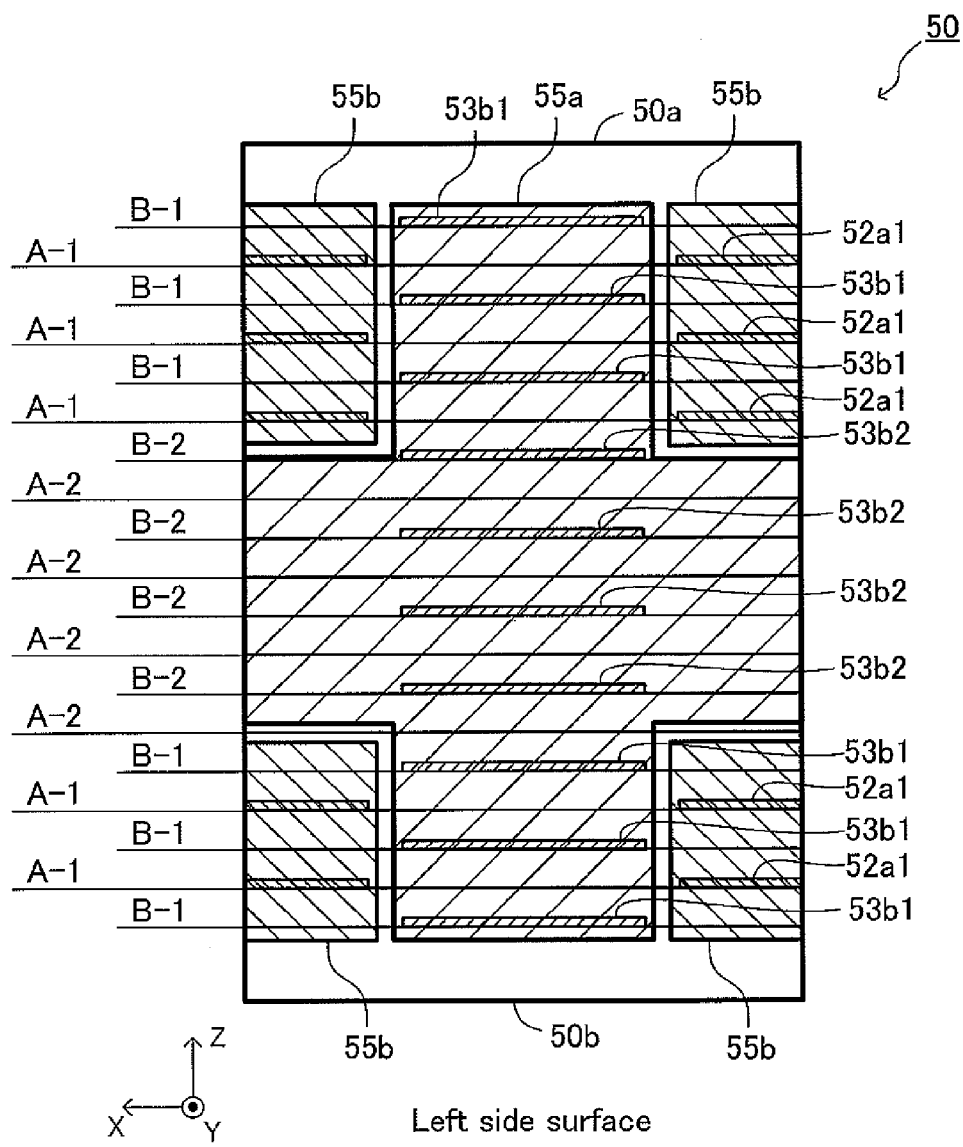
FIG. 8 is a left side view of the piezoelectric element shown in FIG. 3.

As shown in FIG. 8, the left side electrode includes one left side main electrode layer 55a and four left side sub-electrode layers 55b. The left side main electrode layer 55a and the left side sub-electrode layers 55b are formed on the left side surface of the piezoelectric element 50.

The left side main electrode layer 55a has a cross shape as viewed from front. More specifically, both of ends (in an X-axis direction) of a center portion (in a Z-axis direction) of the left side main electrode layer 55a reach both edges (in an X-axis direction) of the piezoelectric element 50. Both of ends (in a Z-axis direction) of a center portion (in an X-axis direction) of the left side main electrode layer 55a reach positions a specific distance away from both edges (in a Z-axis direction) of the piezoelectric element 50; i.e., both of the ends of the center portion do not reach the upper and lower edges of the piezoelectric element 50. The left side main electrode layer 55a is formed so as to cover the ends of the second internal electrode layers (type B1 electrode layers 53b1 and type B2 electrode layers 53b2) exposed on the left side surface of the piezoelectric element 50. Thus, the left side main electrode layer 55a connects the second internal electrode layers together on "the left side surface (i.e., one side surface) of the piezoelectric element 50."

Each of the left side sub-electrode layers 55b has a rectangular shape as viewed from front. More specifically, the left side sub-electrode layers 55b are provided on four corners of the left side surface of the piezoelectric element 50. In other words, the left side sub-electrode layers 55b are provided on regions of the left side surface of the piezoelectric element 50 that are not covered with the left side main electrode layer 55a. Each of the left side sub-electrode layers 55b is formed so as to cover "the ends of the first internal electrode layers (actually, the type A1 electrode layers 52a1)" exposed on the left side surface of the piezoelectric element 50. Therefore, each of the left side sub-electrode layers 55b connects the first internal electrode layers exposed on the left side surface of the piezoelectric element 50. Each of the left side sub-electrode layer 55b is positioned a slight distance away from the left side main electrode layer 55a, and is not connected to the left side main electrode layer 55a.

The protective films are formed of for example, an epoxy resin. The protective films include a front side protective film provided on the front side surface of the piezoelectric element 50, and a back side protective film 56b provided on the back side surface of the piezoelectric element. The front side protective film and the back side protective film 56b have the same shape.

Figure 9:
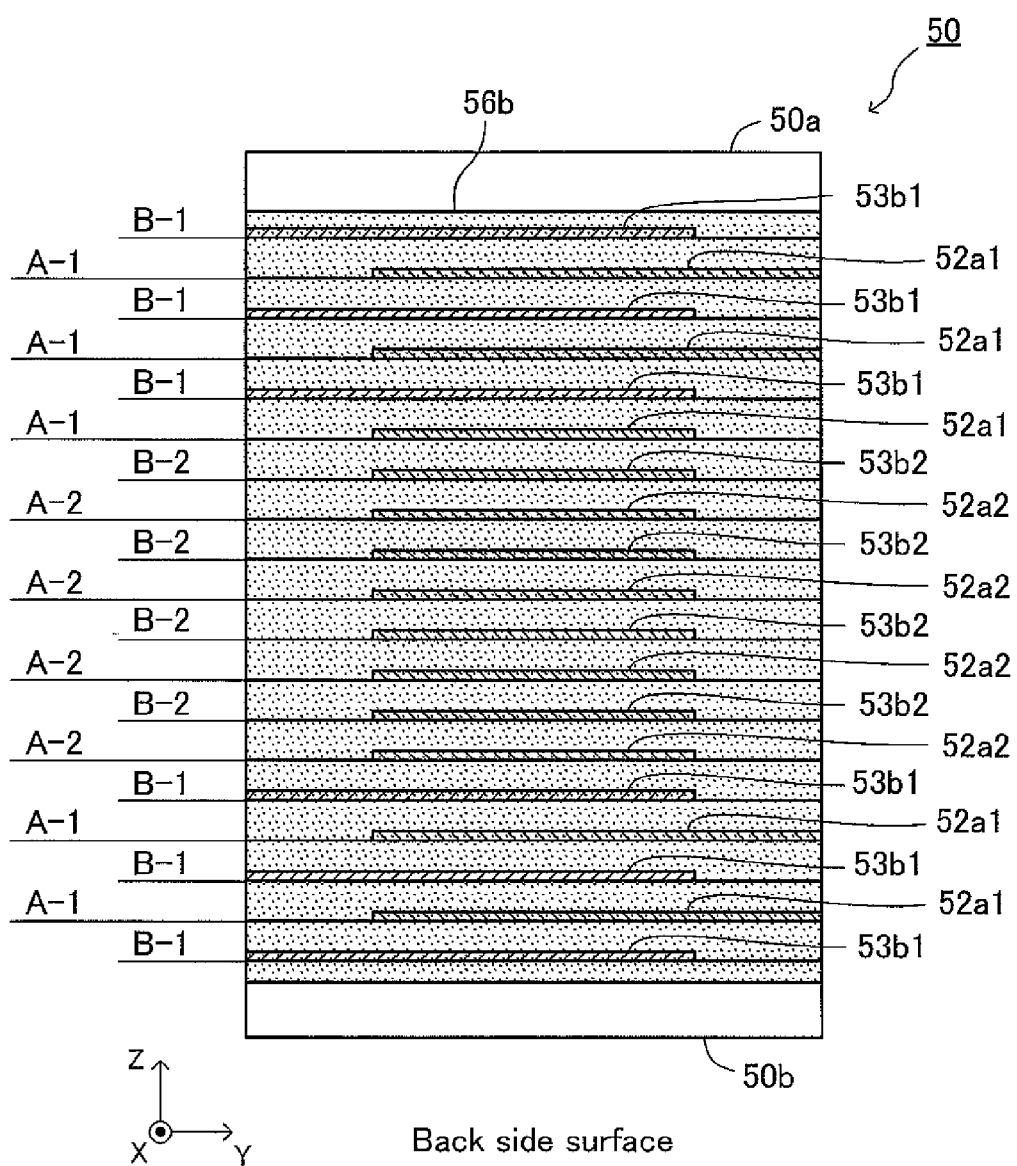
FIG. 9 is a back side view of the piezoelectric element shown in FIG. 3.

For example, as shown in FIG. 9, both of ends (in a Y-axis direction) of the back side protective film 56b reach both of edges (in a Y-axis direction) of the piezoelectric element 50. Both of ends (in a Z-axis direction) of the back protective film 56b reach positions a specific distance away from both of edges (in a Z-axis direction) of the piezoelectric element 50. That is, the end (in a positive Z-axis direction) of the back side protective film 56b does not reach the upper edge of the piezoelectric element 50, and the end (in a negative Z-axis direction) of the back side protective film 56b does not reach the lower edge of the piezoelectric element 50. The back side protective film 56b completely covers the ends of "the first internal electrode layers and the second internal electrode layers" exposed on the back side surface of the piezoelectric element 50. Similarly, the front side protective film completely covers the ends of "the first internal electrode layers and the second internal electrode layers" exposed on the front side surface of the piezoelectric element 50.

The right side dam portion and the left side dam portion are formed of a material containing a novolac epoxy resin as a main component. A conductive material is added to the material (dam portion-forming material), and therefore, semiconductivity is imparted to the right side dam portion and the left side dam portion. The conductive material added is, for example, carbon, Ag, Au, Cu, or an alloy thereof. Particularly preferably, carbon is employed, since it is easy to adjust resistivity of carbon to a desired level. The resistance of a semiconductive film is considerably lower than that of an insulating film, and is considerably higher than that of a conductive film.

Figure 10:
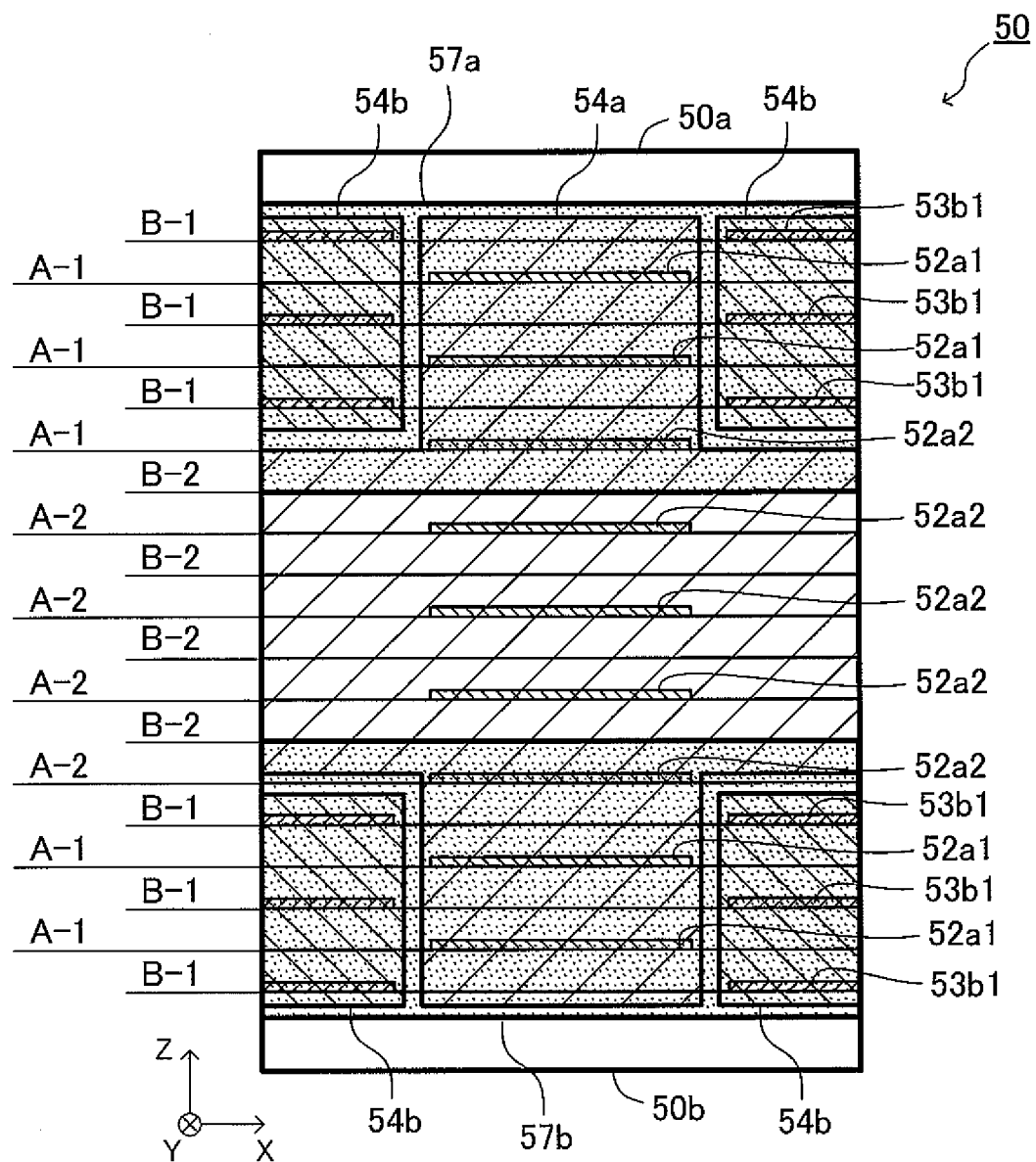
FIG. 10 is a right side view of the piezoelectric element shown in FIG. 3.

As shown in FIG. 10, the right side dam portion includes a right side upper dam portion 57a and a right side lower dam portion 57b. The right side upper dam portion 57a and the right side lower dam portion 57b are formed on the upper portion and the lower portion of the right side surface of the piezoelectric element 50, respectively. The right side upper dam portion 57a and the right side lower dam portion 57b have generally the same rectangular shape as viewed from front.

More specifically, both of ends (in an X-axis direction) of the right side upper dam portion 57a reach both edges (in an X-axis direction) of the piezoelectric element 50. The end (in a positive Z-axis direction) of the right side upper dam portion 57a (i.e., the upper end of the dam portion 57a) reaches "a position between the upper edge of the piezoelectric element 50 and the uppermost type B1 electrode layer 53b1 (i.e., the exposed internal electrode layer which is closest to the upper edge of the right side surface of the piezoelectric element 50)." However, the upper end of the right side upper dam portion 57a does not reach the upper edge of the piezoelectric element 50. That is, the right side upper dam portion 57a covers the exposed type B1 electrode layer 53b1 which is closest to the upper edge of the right side surface of the piezoelectric element 50. The end (in a negative Z-axis direction) of the right side upper dam portion 57a (i.e., the lower end of the dam portion 57a) reaches a position a slight distance away (in a positive Z-axis direction) from the center portion (in a Z-axis direction) of the piezoelectric element 50.

Therefore, the right side upper dam portion 57a connects "the right side main electrode layer 54a and a pair of the right side sub-electrode layers 54b" provided at the upper portion of the right side surface. In other words, the right side upper dam portion 57a is formed so as to reach the right side main electrode layer 54a and a pair of the right side sub-electrode layers 54b. Thus, the first internal electrode layer and the second internal electrode layer are connected via the semiconductive film (i.e., the right side upper dam portion 57a).

Both of ends (in an X-axis direction) of the right side lower dam portion 57b reach both edges (in an X-axis direction) of the piezoelectric element 50. The end (in a positive Z-axis direction) of the right side lower dam portion 57b (i.e., the upper end of the dam portion 57b) reaches a position a slight distance away (in a negative Z-axis direction) from the center portion (in a Z-axis direction) of the piezoelectric element 50. The end (in a negative Z-axis direction) of the right side lower dam portion 57b (i.e., the lower end of the dam portion 57b) reaches "a position between the lower edge of the piezoelectric element 50 and the lowermost type B1 electrode layer 53b1 (i.e., the exposed internal electrode layer which is closest to the lower edge of the right side surface of the piezoelectric element 50)." However, the lower end of the right side lower dam portion 57b does not reach the lower edge of the piezoelectric element 50. That is, the right side lower dam portion 57b covers the exposed type B1 electrode layer 53b1 which is closest to the lower edge of the right side surface of the piezoelectric element 50.

Therefore, the right side lower dam portion 57b connects "the right side main electrode layer 54a and a pair of the right side sub-electrode layers 54b" provided at the lower portion of the right side surface. In other words, the right side lower dam portion 57b is formed so as to reach the right side main electrode layer 54a and a pair of the right side sub-electrode layers 54b. Thus, the first internal electrode layer and the second internal electrode layer are connected via the semiconductive film (i.e., the right side lower dam portion 57b).

The right side upper dam portion 57a and the right side lower dam portion 57b are provided on the right side surface of the piezoelectric element 50 in such a manner that they are separated from each other by a specific distance in the vicinity of the center portion in a Z-axis direction. Therefore, the right side main electrode layer 54a is exposed in the vicinity of the center portion (in a Z-axis direction) of the right side surface of the piezoelectric element 50. The exposed portion of the right side main electrode layer 54a is soldered to a non-illustrated external wiring.

The right side upper dam portion 57a extends (exists) between the exposed portion of the right side main electrode layer 54a and the top surface 50a of the piezoelectric element 50. Therefore, even when the epoxy resin adhesive S is applied to the top surface 50a, the epoxy bleed out of the adhesive S is blocked by the right side upper dam portion 57a. Thus, since a bled-out portion of the adhesive S is prevented from reaching the exposed portion of the right side main electrode layer 54a, the exposed portion can be strongly soldered to the external wiring.

Figure 11:
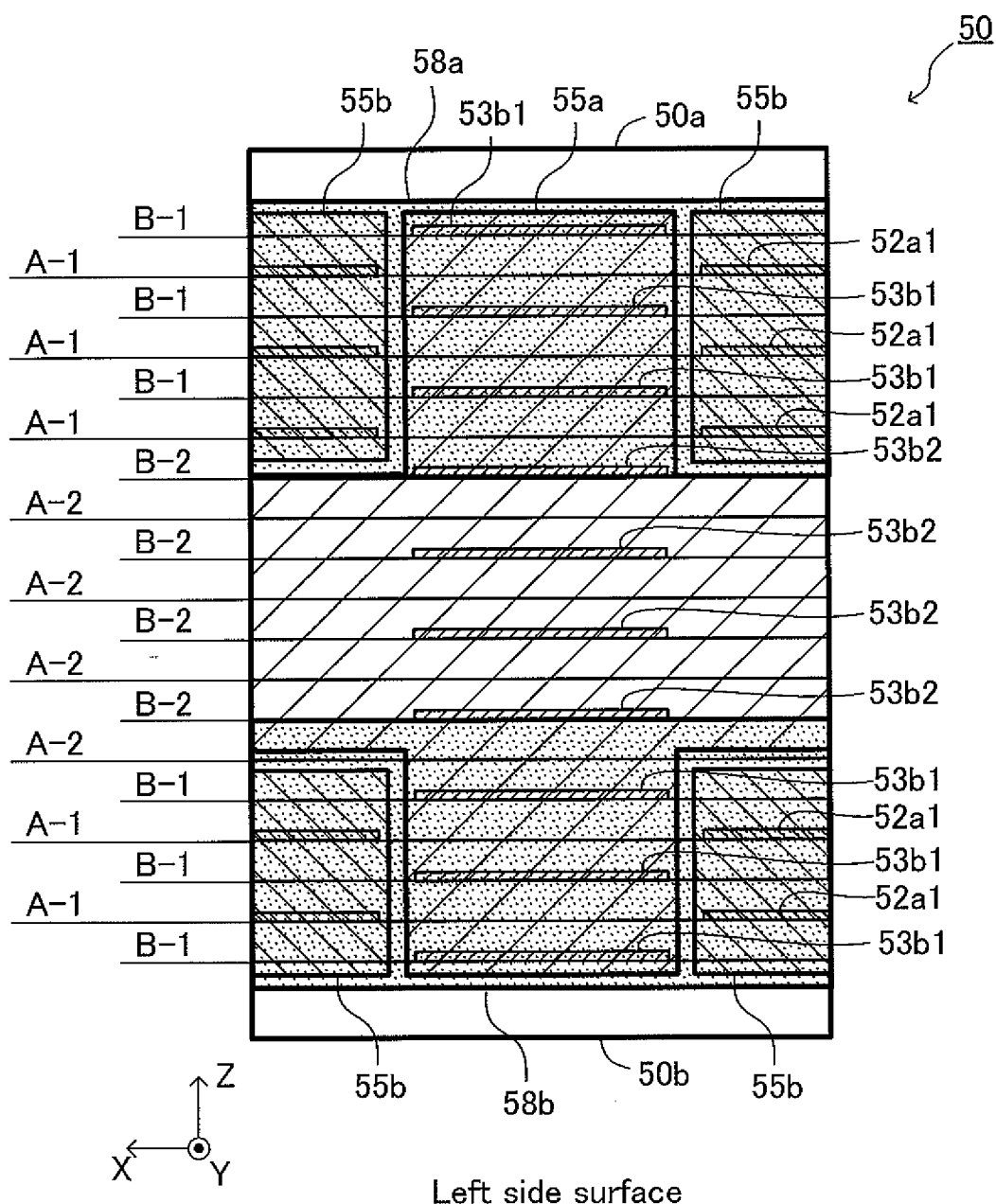
FIG. 11 is a left side view of the piezoelectric element shown in FIG. 3.

As shown in FIG. 11, the left side dam portion includes a left side upper dam portion 58a and a left side lower dam portion 58b. The left side upper dam portion 58a and the left side lower dam portion 58b are formed on the upper portion and the lower portion of the left side surface of the piezoelectric element 50, respectively. The left side upper dam portion 58a and the left side lower dam portion 58b have generally the same rectangular shape as viewed from front.

More specifically, both of ends (in an X-axis direction) of the left side upper dam portion 58a reach both edges (in an X-axis direction) of the piezoelectric element 50. The end (in a positive Z-axis direction) of the left side upper dam portion 58a (i.e., the upper end of the dam portion 58a) reaches "a position between the upper edge of the piezoelectric element 50 and the uppermost type B1 electrode layer 53b1 (i.e., the exposed internal electrode layer which is closest to the upper edge of the left side surface of the piezoelectric element 50)." However, the upper end of the left side upper dam portion 58a does not reach the upper edge of the piezoelectric element 50. That is, the left side upper dam portion 58a covers the exposed type B1 electrode layer 53b1 which is closest to the upper edge of the left side surface of the piezoelectric element 50. The end (in a negative Z-axis direction) of the left side upper dam portion 58a (i.e., the lower end of the dam portion 58a) reaches a position a slight distance away (in a positive Z-axis direction) from the center portion (in a Z-axis direction) of the piezoelectric element 50.

Therefore, the left side upper dam portion 58a connects "the left side main electrode layer 55a and a pair of the left side sub-electrode layers 55b" provided at the upper portion of the left side surface. In other words, the left side upper dam portion 58a is formed so as to reach the left side main electrode layer 55a and a pair of the left side sub-electrode layers 55b. Thus, the first internal electrode layer and the second internal electrode layer are connected via the semiconductive film (i.e., the left side upper dam portion 58a).

Both ends (in an X-axis direction) of the left side lower dam portion 58b reach both edges (in an X-axis direction) of the piezoelectric element 50. The end (in a positive Z-axis direction) of the left side lower dam portion 58b (i.e., the upper end of the dam portion 58b) reaches a position a slight distance away (in a negative Z-axis direction) from the center portion (in a Z-axis direction) of the piezoelectric element 50. The end (in a negative Z-axis direction) of the left side lower dam portion 58b (i.e., the lower end of the dam portion 58b) reaches "a position between the lower edge of the piezoelectric element 50 and the lowermost type B1 electrode layer 53b1 (i.e., the exposed internal electrode layer which is closest to the lower edge of the left side surface of the piezoelectric element 50)." However, the lower end of the left side lower dam portion 58b does not reach the lower edge of the piezoelectric element 50. That is, the left side lower dam portion 58b covers the exposed type B1 electrode layer 53b1 which is closest to the lower edge of the left side surface of the piezoelectric element 50.

Therefore, similar to the case of the right side lower dam portion 57b, the left side lower dam portion 58b connects "the left side main electrode layer 55a and a pair of the left side sub-electrode layers 55b" provided at the lower portion of the left side surface. Thus, the first internal electrode layer and the second internal electrode layer are connected via the semiconductive film (i.e., the left side lower dam portion 58b).

The left side upper dam portion 58a and the left side lower dam portion 58b are provided on the left side surface of the piezoelectric element 50 in such a manner that they are separated from each other by a specific distance in the vicinity of the center portion in a Z-axis direction. Therefore, the left side main electrode layer 55a is exposed in the vicinity of the center portion (in a Z-axis direction) of the left side surface of the piezoelectric element 50. The exposed portion of the left side main electrode layer 55a is soldered to a non-illustrated external wiring.

The left side upper dam portion 58a extends (exists) between the exposed portion of the left side main electrode layer 55a and the top surface 50a of the piezoelectric element 50. Therefore, even when the epoxy resin adhesive S is applied to the top surface 50a, the epoxy bleed out of the adhesive S is blocked by the left side upper dam portion 58a. Thus, since a bled-out portion of the adhesive S is prevented from reaching the exposed portion of the left side main electrode layer 55a, the exposed portion can be strongly soldered to the external wiring.

In addition, the first internal electrode layers 52 and the second internal electrode layers 53 are connected by means of a plurality of the semiconductive dam portions (i.e., the right side upper dam portion 57a, the right side lower dam portion 57b, the left side upper dam portion 58a, and the left side lower dam portion 58b). Therefore, since the pyroelectric effect—which would otherwise occur when the piezoelectric element 50 undergoes a drastic temperature change—can be suppressed, occurrence of depolarization can be prevented in the piezoelectric element 50. That is, the second device 40 can solve, only by provision of the aforementioned dam portions, both a problem due to the epoxy bleed out of the adhesive S and a problem due to occurrence of the pyroelectric effect (occurrence of depolarization) at the same time.

Examples and Comparative Example

Samples corresponding to the second device 40 (Examples 1 and 2), and a sample which has the same configuration as the second device but does not have the dam portions (right side dam portion and left side dam portion) (Comparative Example) were produced. Experiments were carried out for comparing the thus-produced samples. The experimental results are shown in Table 1.

TABLE 1

| | Presence or absence of dam portion | Width of dam portion W1 | Material of dam portion | Conductive material | Epoxy bleed out to side electrode layer | Bleed out width *2 | Insulation resistance | Percent change in capacitance after thermal shock resistance test |
|---|---|---|---|---|---|---|---|---|
| Comparative Example 1 | Absence | — | — | — | Occurrence | 0.4 mm | — | −15% |
| Example 1 | Presence | 0.1 mm | *1 | No addition | None | — | 10 GΩ | −15% |
| Example 2 | Presence | 0.1 mm | *1 | Addition | None | — | 1 MΩ | −2% |

*1: Novolac epoxy resin
*2: Width of a portion which has changed color, measured from an upper edge to a side surface In Example 2 shown in Table 1, a conductive material added into the novolac epoxy resin forming the dam portion was carbon. The "insulation resistance" corresponds to a DC insulation resistance between the first internal electrode layer and the second internal electrode layer. In the "thermal shock resistance test," each sample is subjected to a plurality of thermal cycles, each consisting of heating from room temperature to 80° C. and then cooling to −40° C. "Percent change in capacitance" is the amount of reduction in capacitance between the first internal electrode layer and the second internal electrode layer after the thermal shock resistance test, where the capacitance between the first internal electrode layer and the second internal electrode layer before the thermal shock resistance test is taken (treated) as 1 (100%).

As is clear from Table 1, when a dam portion formed of a novolac epoxy resin is provided, the epoxy bleed out of an adhesive S is effectively suppressed. As is also clear from Table 1, when a conductive material (carbon in the present example) is added into the material of the dam portion, the amount of reduction in capacitance after the thermal shock resistance test is considerably reduced; i.e., occurrence of depolarization due to the pyroelectric effect is suppressed.

As described above, each of the electronic devices according to the embodiments of the present invention includes the element (20 or 50) having an outer surface electrode (e.g., the side electrode 24, the right side main electrode layer 54a, the ride side sub-electrode layer 54b, the left side main electrode layer 55a, or the left side sub-electrode layer 55b) provided on a part of surfaces of the element (e.g., the right or left side surface of the element 20 or the element 50); and a member (e.g., the driven member 30) bonded to the element by means of an epoxy resin adhesive, wherein the adhesive is applied to a portion of the surfaces of the element (e.g., the top surface 20a or 50a of the piezoelectric element) other than a portion on which the outer surface electrode is provided, and the electronic device further includes, between the adhesive and the outer surface electrode, a dam portion formed of a material for preventing epoxy bleed out of the adhesive (e.g., the dam portion 28, the right side upper dam portion 57a, or the left side upper dam portion 58a). Thus, since the dam portion blocks propagation of the epoxy bleed out, the adverse effects due to the epoxy bleed out on "the electrode provided on the outer surface of the element (i.e., outer surface electrode)" can be eliminated.

It should be noted that the element of the electronic device may be any of the aforementioned layered piezoelectric element, or "a piezoelectric film element (a single layer piezoelectric element) including a piezoelectric layer, and a first electrode layer and a second electrode layer sandwiching the piezoelectric layer and facing each other."

Further, the outer surface electrodes of the piezoelectric element 50 connected by the semiconductive dam portion (e.g., the right side upper dam portion 57a) are the first electrode which is the electrode layer (e.g., the right side main electrode layer 54a) connected to the ends of the first electrode layers (the type A1 electrode layers 52a1 and the type A2 electrode layers 52a2, that are the first internal electrode layers), and the second electrode which is the electrode layer (e.g., the right side sub-electrode layer 54b) connected to the ends of the second electrode layers (the type B1 electrode layers 53b1 that are the second internal electrode layers). However, the right side sub-electrode layer 54b may be omitted. In this case, the outer surface electrodes of the piezoelectric element 50 connected by the semiconductive dam portion (e.g., the right side upper dam portion 57a) may be the first electrode (the right side main electrode layer 54a) which is the layer connected to the ends of the first electrode layers, and the electrodes formed of the ends of the second electrode layers (e.g., the ends themselves of the type B1 electrode layers 53b1 which is the second internal electrode layers, the ends being exposed on the right side surface).

Alternatively, the outer surface electrodes of the piezoelectric element 50 connected by the semiconductive dam portion (e.g., the right side upper dam portion 57a) may be the first electrode formed of the ends of the first electrode layers (the type A1 electrode layers 52a1 and the type A2 electrode layers 52a2 that are the first internal electrode layers), the ends being exposed on the right side surface (outer surface) of the piezoelectric element 50, and the second electrode formed of the ends of the second electrode layers (the type B1 electrode layers 53b1 that are the second internal electrode layers), the ends being exposed on the right side surface (outer surface) of the piezoelectric element 50.

In the aforementioned embodiments, the piezoelectric element 20 or the piezoelectric element 50 is a polyhedron having a rectangular parallelepiped shape. However, the piezoelectric element may be a polyhedron whose cross-sectional shape (a cross sectional shape along an X-Y plane) is polygonal shape (e.g., a hexagonal or octagonal shape) other than quadrangle.

The piezoelectric element 50 may also be expressed, for example, as being configured so as to include:

"the element being a polyhedral layered piezoelectric element formed of a plurality of the piezoelectric products (active piezoelectric layers) wherein the piezoelectric products are layered (stacked);

the ends of two or more of the first electrode layers (the type A1 electrode layers 52a1 and the type A2 electrode layers 52a2) included in the element being exposed on one side surface (e.g., the right side surface) of the polyhedron;

the ends of two or more of the second electrode layers (the type B1 electrode layers 53b1 and the type B2 electrode layers 53b2) included in the element being exposed on said one side surface (e.g., the right side surface);

the first electrode being an electrode layer (the right side main electrode layer 54a) connecting, on said one side surface (e.g., the right side surface), the ends of the two or more first electrode layers exposed on said one side surface; and the second electrode being an electrode layer (the right side sub-electrode layer 54b) connecting, on said one side surface, the ends of the two or more second electrode layers (type B1 electrode layers 53b1) exposed on said one side surface."

The present invention is not limited to the aforementioned embodiments, and various modifications may be made within the scope of the present invention. For example, the present invention can be applied to an electronic device other than the aforementioned electronic device including the piezoelectric element as the element (e.g., an electronic device including, for example, a semiconductor element, an IC chip, or the like).

Figure 12:
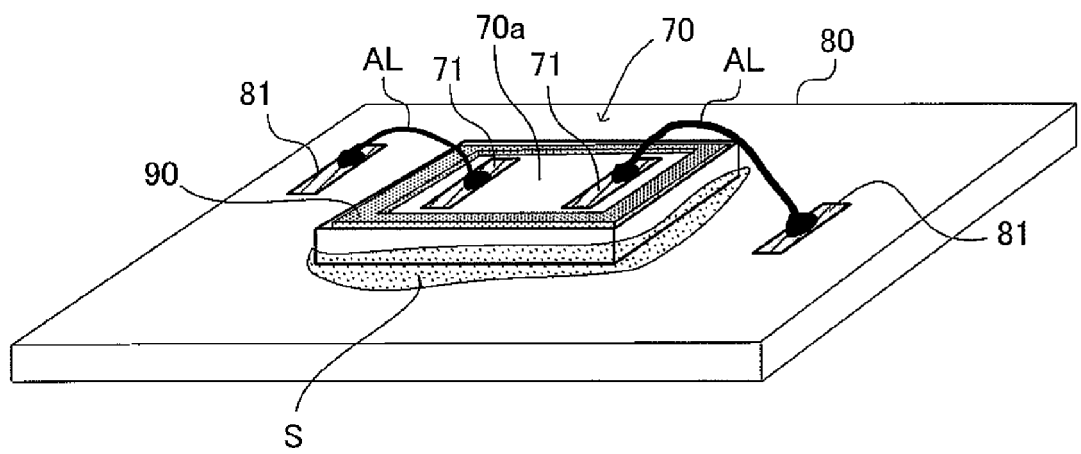
FIG. 12 is a schematic view of a modification of the present invention.
Figure 13:
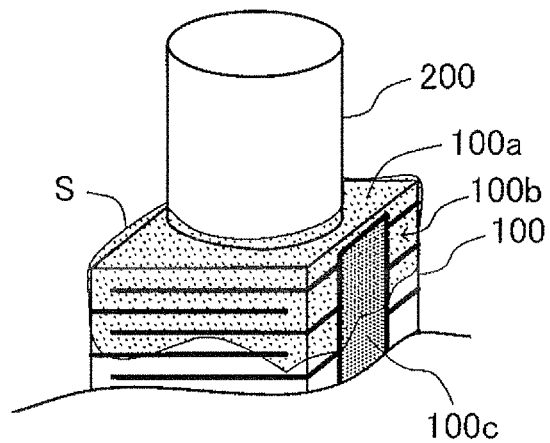
FIG. 13 is a schematic perspective view of an electronic device to which the present invention is not applied.

Specifically, the present invention can also be applied to, for example, the case shown in FIG. 12. In this example, an IC chip 70 is bonded to a substrate 80 by means of an adhesive S. Therefore, the substrate 80 is a member which is bonded, by means of the epoxy resin adhesive S, to the IC chip 70 serving as an element. The IC chip 70 has electrodes (outer surface electrodes) 71 on its outer surface (the top surface 70a in the example shown in FIG. 12). The electrodes 71 are connected to electrodes 81 on the substrate 80 via wires AL by soldering. In this case, according to the present invention, a dam portion 90 is provided between "the adhesive S and the electrodes 71". Therefore, the electrodes 71 are prevented from being covered with a bled-out portion of the components of the adhesive S, to thereby improve reliability of the junction between the wire AL and the electrode 71.

Furthermore, the dam portion may be provided so as to surround the outer surface electrodes.

The invention claimed is:

1. An electronic device comprising an element having an outer surface electrode provided on a portion of outer surfaces of said element; and a member bonded to said element by means of an epoxy resin adhesive, wherein, said adhesive is applied to a portion of said outer surfaces other than said portion on which said outer surface electrode is provided, and a dam portion formed of a material different from that of said element for preventing epoxy bleed out of said adhesive is provided between said adhesive and said outer surface electrode.

2. An electronic device according to claim 1, wherein said material forming said dam portion is a material containing a novolac epoxy resin as a main component.

3. An electronic device according to claim 2, wherein:

said element comprises a piezoelectric product including a piezoelectric layer, and a first electrode layer and a second electrode layer which face each other and sandwich said piezoelectric layer;

said outer surface electrode comprises a first electrode which is an electrode formed of an end of said first electrode layer, or an electrode layer connected to said end of said first electrode layer, and a second electrode which is an electrode formed of an end of said second electrode layer, or an electrode layer connected to said end of said second electrode layer; and said dam portion has semiconductivity by adding a conductive material to said material forming said dam portion, and said dam portion is formed so as to reach both said first electrode and said second electrode.

4. An electronic device according to claim 3, wherein:

said element is a polyhedral layered piezoelectric element formed of a plurality of said piezoelectric products;

ends of two or more first electrode layers included in said element are exposed on one side surface of said polyhedron;

ends of two or more second electrode layers included in said element are exposed on said one side surface of said polyhedron;

said first electrode is an electrode layer which connects, on said one side surface, said ends of said two or more first electrode layers exposed on said one side surface; and said second electrode is an electrode layer which connects, on said one side surface, said ends of said two or more second electrode layers exposed on said one side surface.

5. An electronic device comprising an element having an outer surface electrode provided on a portion of outer surfaces of said element; and a member bonded to said element by means of an epoxy resin adhesive, wherein, said adhesive is applied to a portion of said outer surfaces other than said portion on which said outer surface electrode is provided, and a dam portion formed of a resin material for preventing epoxy bleed out of said adhesive is provided between said adhesive and said outer surface electrode.

\* \* \* \* \*